(12) United States Patent
Thomson

(10) Patent No.: US 7,410,900 B2
(45) Date of Patent: Aug. 12, 2008

(54) METALLISATION

(75) Inventor: James Thomson, Dundee (GB)

(73) Assignee: Ceimig, Cunninghamhead, Kilmarnock, Ayrshire (GB)

( * ) Notice: Subject to any disclaimer, the term of this patent is extended or adjusted under 35 U.S.C. 154(b) by 367 days.

(21) Appl. No.: 10/518,952

(22) PCT Filed: Jun. 18, 2003

(86) PCT No.: PCT/GB03/02613

§ 371 (c)(1),
(2), (4) Date: May 10, 2005

(87) PCT Pub. No.: WO03/106734

PCT Pub. Date: Dec. 24, 2003

(65) Prior Publication Data

US 2005/0227181 A1  Oct. 13, 2005

(30) Foreign Application Priority Data

Jun. 18, 2002 (GB) .................... 0213925.1

(51) Int. Cl.
*H01L 21/302* (2006.01)
(52) U.S. Cl. .............. 438/686; 438/656; 438/687; 257/E21.295; 257/E21.299
(58) Field of Classification Search ................. 438/523; 257/E21.299
See application file for complete search history.

(56) References Cited

U.S. PATENT DOCUMENTS

| 4,530,879 A | | 7/1985 | Drahnak |
| 5,534,312 A | * | 7/1996 | Hill et al. ..................... 427/533 |
| 6,348,239 B1 | * | 2/2002 | Hill et al. ..................... 427/533 |

FOREIGN PATENT DOCUMENTS

| EP | 0 391 314 A | 10/1990 |
| EP | 0 493 709 A | 7/1992 |
| FR | 2 643 775 A | 8/1990 |
| WO | 96 29726 A | 9/1996 |

* cited by examiner

*Primary Examiner*—Scott B. Geyer
*Assistant Examiner*—Cheung Lee
(74) *Attorney, Agent, or Firm*—Gifford, Krass, Sprinkle, Anderson & Citkowski, P.C.

(57) ABSTRACT

This invention relates to photosensitive organometallic compounds which are used in the production of metal deposits. In particular, this invention relates to photosensitive organometallic compounds such as bis-(perfluoropropyl)-1,5-cyclooctadiene platinum (II) (i.e. $(C_3F_7)_2PtC_8H_{12}$) which on exposure to UV radiation and then a reduction process forms a platinum metal deposit such as a substantially continuous thin 'sheet-like' film or a substantially narrow line which is capable of electrical conduction.

9 Claims, 14 Drawing Sheets

TGA of $(C_3F_7)_2PtC_8H_{12}$

METALLISATION

CROSS-REFERENCE TO RELATED APPLICATION

This application is 371 of PCT/GB03/02613, filed Jun. 18, 2003 which claims the benefit of United Kingdom Patent Application No. 0213925.1, filed Jun. 18, 2002. The disclosures of the above applications are incorporated herein by reference.

FIELD OF THE INVENTION

This invention relates to photosensitive organometallic compounds which are used in the production of metal deposits. In particular, this invention relates to photosensitive organometallic compounds such as bis-(perfluoropropyl)-1,5-cyclooctadiene platinum (II) (i.e. $(C_3F_7)_2PtC_8H_{12}$) which on exposure to UV radiation and then a reduction process forms a platinum metal deposit such as a substantially continuous thin 'sheet-like' film or a substantially narrow line which is capable of electrical conduction.

BACKGROUND OF THE INVENTION

Thin metal lines are required in integrated circuitry in, for example, opto-electronics, semiconductor technologies and electronic surgical implants.

For nanoscale circuits, conventional methods using metallic inks or mask and etch processes do not as yet possess the requirements which can ensure the deposition of accurate straight lines of high resolution, and the formation of perfect right angles rather than arcs during integrated circuit manufacture. Furthermore, if high resolution is not obtained high density interconnects cannot be manufactured.

It is an object of the present invention to obviate and/or mitigate against this.

SUMMARY OF THE INVENTION

According to a first aspect of the present invention there is provided a method for forming metal deposits on a substrate comprising:
 a) depositing a photosensitive organometallic compound onto a substrate;
 b) irradiating the photosensitive organometallic compound with UV radiation;
 c) reducing the irradiated photosensitive organometallic compound to form metal deposits adhered to the substrate; and
 d) removing any degraded photosensitive organometallic compound residue and unaffected photosensitive organometallic compound from said substrate.

Typically, the reduction process in step c) comprises:
1) a first heating and cooling stage;
2) a second heating and cooling stage in an oxidising atmosphere;
3) flowing an inert gas over the substrate; and
4) a third heating and cooling stage wherein a reducing gas flows over the substrate to form metal deposits.

The metal deposits may be of any shape or configuration such as a substantially continuous thin 'sheet-like' film or a substantially narrow line. By appropriate focussing of a UV beam, it is possible to create features with nanometer dimensions. Metal lines of less than 70 nm for example may be formed on the substrate.

Typically, the metal deposits are securely adhered to the substrate.

The first heating and cooling stage may be in an inert atmosphere such as noble gas, e.g. dinitrogen.

Conveniently, the second heating and cooling stage is performed in a dioxygen containing atmosphere such as air.

Typically, the reducing gas in the third heating and cooling stage comprises at least dihydrogen.

Any unreacted photosensitive organometallic compound may be removed via a sublimation step or a washing step.

The photosensitive organometallic compounds of the present invention are compounds which, upon exposure to UV irridiation and subsequent reduction are converted to metals.

Typically, the photosensitive organometallic compound is a platinum organometallic.

Alternatively, the photosensitive organometallic compound contains any of the following metals: palladium, copper, rhodium, tungsten, iridium, silver, gold and tantalum.

Typically, the photosensitive organometallic compounds are the compounds of formula (I) as described below.

In particular, the photosensitive organometallic compounds are selected from any of the following: bis-(perfluoropropyl)-1,5-cyclooctadiene platinum (II); bis-(perfluoropropyl)-1-methyl-1,5-cyclooctadiene platinum (II); and bis-(perfluoropropyl)-1-fluoromethyl-1,5-cyclooctadiene platinum (II).

The organometallic compound may be deposited using for example any of the following: a vacuum coating technique, a spinning technique, a surface tension coating technique or a hot spray technique.

Conveniently, a thin film of about 10 mg to 500 mg of organometallic is deposited onto a substrate.

A thin film of about 100 mg of photosensitive organometallic may be deposited onto a substrate.

Typically, the TV radiation has a wavelength of about 150-400 nm.

Preferably, the UV radiation has a wavelength of about 260 nm.

Conveniently, a dose of about 10-500 $Jcm^{-2}$ of UV radiation is irradiated onto the substrate.

Preferably, a dose of about 100 $Jcm^{-2}$ of UV radiation is irradiated onto the substrate.

Conveniently, a UV mask is used to form a specific pattern of metal deposit.

Alternatively, the metal deposits are formed directly with a UV beam in a "direct writing" technique.

Typically, the reduction process comprises:
 (1) heating the coated substrate from about 25° C. to about 120° C. at a ramp rate of about 2° C. per minute; maintaining the temperature at about 80° C. for about 60 minutes; and then cooling the substrate from about 80° C. to about 25° C. at a ramp rate of about 10° C. per minute; wherein $N_2$ is flowed over the coated substrate at a rate of about 50 ml per minute;
 (2) heating the substrate from about 25° C. to about 250° C. at a ramp rate of about 5° C. per minute; maintaining the temperature at about 250° C. for about 60 minutes; and then cooling the substrate from about 250° C. to about 25° C. at a ramp rate of about 5° C. per minute; wherein the coated substrate is exposed to air;
 (3) flowing $N_2$ at about 25° C. over the coated substrate for about 10 minutes; and
 (4) heating the coated substrate from about 25° C. to about 350° C. at a ramp rate of about 20° C. per minute; maintaining the temperature at about 350° C. for about 60 minutes; and then cooling the substrate from about 350° C. to about 25° C. at a rate of about 20° C. per minute; wherein a mixture of about 5% $H_2$ and 95% $N_2$ is flowed over the coated substrate at a rate of about 150 ml per minute.

Alternatively, the reduction process comprises:
(1) heating the coated substrate from about 25° C. to about 120° C. at a ramp rate of about 2° C. per minute; maintaining the temperature at about 80° C. for about 60 minutes; and then cooling the substrate from about 80° C. to about 25° C. at a ramp rate of about 10° C. per minute; wherein $N_2$ is flowed over the coated substrate at a rate of about 50 ml per minute;
(2) heating the substrate from about 25° C. to about 350° C. at a ramp rate of about 20° C. per minute; maintaining the temperature at about 350° C. for about 60 minutes; and then cooling the substrate from about 350° C. to about 25° C. at a ramp rate of about 20° C. per minute; wherein the coated substrate is exposed to air;
(3) flowing $N_2$ at about 25° C. over the coated substrate for about 10 minutes; and
(4) heating the coated substrate from about 25° C. to about 350° C. at a ramp rate of about 20° C. per minute; maintaining the temperature at about 350° C. for about 60 minutes; and then cooling the substrate from about 350° C. to about 25° C. at a rate of about 20° C. per minute; wherein a mixture of about 5% $H_2$ and 95% $N_2$ is flowed over the coated substrate at a rate of about 150 ml per minute.

According to a second aspect of the present invention there is provided metal deposits formed according to the first aspect.

The metal deposits may be of any shape or configuration such as a substantially continuous thin 'sheet-like' film or a substantially narrow line.

Typically, the metal deposits are securely adhered to the substrate.

The metal deposits may be platinum.

Alternatively, the metal deposits are selected from any of the following: palladium, copper, rhodium, tungsten, iridium, silver, gold and tantalum.

Preferably, the metal deposits are uniform and continuous.

Typically, the metal deposits may have a width of 60 nm to 20 nm.

Conveniently, the metal deposits may have a thickness of 5 nm to 20 nm.

By masking parts of a substrate metal deposits in predetermined patterns may be obtained.

Typically, the metal deposits have good conducting properties.

According to a third aspect of the present invention there is provided compounds according to the following formula (I):

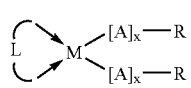

(I)

wherein:
M is any of platinum, palladium, copper, rhodium, tungsten, iridium, silver, gold and tantalum;
A is any of oxygen, sulphur, an amide grouping, an amine grouping or an ester grouping;
x is 0 or 1;
R is a fluoroorgano group; and
L is a bidentate ligand.

Typically, A is oxygen.

Typically, x is 0.

The fluoroorgano group may be selected from any fluoro derivatives of the following: a $C_{1-12}$ alkyl, a $C_{1-12}$ alkenyl, a $C_{1-12}$ alkynyl or a $C_{1-12}$ aryl grouping which may be substituted or unsubstituted and/or linear or branched.

The fluoroorgano group may be selected from any fluoro derivatives of the following: a $C_{1-4}$ alkyl, a $C_{1-4}$ alkenyl, a $C_{1-4}$ alkynyl or a $C_{1-4}$ aryl grouping which may be substituted or unsubsituted or linear or branched.

Typically, the fluoroorgano group may be selected from any fluoro derivatives of the following: methyl, ethyl, n-propyl, iso-propyl, n-butyl, iso-butyl or tert-butyl.

Conveniently, the fluoroorgano group may be a perfluoroorgano group.

The bidentate ligand may be cyclic or non-cyclic.

The bidentate ligand may comprise for example two olefin groups, and as such-may be 1,5-cyclooctadiene or derivatives of thereof such as 1-methyl-1,5-cyclooctadiene and 1-fluoromethyl-1,5-cyclooctadiene.

Alternatively, the bidentate ligand may be cyclooctatetraene or derivatives thereof.

Typically, the compound shown by formula (I) may be a bis-substituted (perfluoroorgano) cyclooctadiene platinum (II) compound.

Conveniently, the compound shown by formula (I) may be selected from any of the following: bis-(perfluoropropyl)-1,5-cyclooctadiene platinum (II); bis-(perfluoropropyl)-1-methyl-1,5-cyclooctadiene platinum (II); and bis-(perfluoropropyl)-1-fluoromethyl-1,5-cyclooctadiene platinum (II).

According to a fourth aspect of the present invention there is provided a process for forming compounds according to the first aspect defined by formula (I) comprising forming a reaction mixture of:

a) compounds according to formula (II) as shown below:

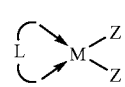

(II)

wherein:
M is any of platinum, palladium, copper, rhodium, tungsten, iridium, silver, gold and tantalum;
L is a bidentate ligand; and
Z is an organo grouping;
and
b) compounds defined as follows according to formula (III):

h-[A]$_x$-R    (III)

wherein:
h is a halide;
A is any of oxygen, sulphur, an amide grouping, an amine grouping or an ester grouping;
x is 0 or 1; and
R is a fluoroorgano grouping;
and subjecting the reaction mixture to conditions such that compounds according to formula (I) are formed.

The mixing of the reaction mixture may be performed under darkness or in ambient conditions.

The compound shown by formula (II) may be in a solvent.

Typically, the compound shown by formula (II) in the solvent is added to the compound shown by formula (III).

Conveniently, the compound shown by formula (I) is obtained by filtering off the precipitate and evaporating off any remaining solvent or any other volatile substances.

The obtained precipitate may be purified using recrystallisation and/or a chromatographic technique.

The obtained precipitate may be purified by redissolving the obtained precipitate in a solvent and running the obtained solution down a chromatographic column and collecting the fraction containing the purified compound of formula (I) and then crystallising the collected fraction from, for example, a solution of methylene chloride/pentane solution.

The solvent used to dissolve the compound shown by formula (II) may be an organic solvent such as an aromatic or aliphatic hydrocarbon or the like. In particular, the organic solvent may be methylene chloride or chloroform.

The compound shown by formula (III) may be selected from any of the following: perfluoroorgano-iodide, perfluoroorgano-bromide, perfluoroorgano-chloride and perfluoroorgano-fluoride.

The organo group of the fluoroorgano group in formula (II) or formula (III) may be selected from any of the following: a $C_{1-12}$ alkyl, a $C_{1-12}$ alkenyl, a $C_{1-12}$ alkynyl or a $C_{1-12}$ aryl grouping which may be substituted or unsubstituted and/or linear or branched.

The organo group of the group in formula (II) or formula (III) may be selected from any of the following: a $C_{1-4}$ alkyl, a $C_{1-4}$ alkenyl, a $C_{1-4}$ alkynyl or a $C_{1-4}$ aryl grouping which may be substituted or unsubstituted or linear or branched.

The organo group of the fluoroorgano group in formula (II) or formula (III) may be selected from any combinations of the following: methyl, ethyl, n-propyl, iso-propyl, n-butyl, iso-butyl, tert-butyl, cyclopentyl or cyclohexyl.

The compound shown by formula (III) may be selected from any of the following: n-perfluoropropyl iodide; a perfluorobutyl iodide or the like.

Typically, the mixing of the reaction mixture takes place under an inert atmosphere and comprises shaking for five days.

Conveniently, the inert atmosphere is selected from any of the noble gases or nitrogen.

Typically, the compound shown by formula (II) is a bis-substituted organo platinum(II) cyclooctadiene compound.

Conveniently, the compound formed according to formula (I) is selected from any of the following: bis-(perfluoropropyl)-1,5-cyclooctadiene platinum (II); bis(perfluoropropyl)-1-methyl-1,5-cyclooctadiene platinum (II); and bis-(perfluoropropyl)-1-fluoromethyl-1,5-cyclooctadiene platinum (II).

BRIEF DESCRIPTION OF THE DRAWINGS

Embodiments of the present invention will now be described, by way of example only, with reference to the accompanying drawings in which.

DETAILED DESCRIPTION OF THE INVENTION

Figure 1:
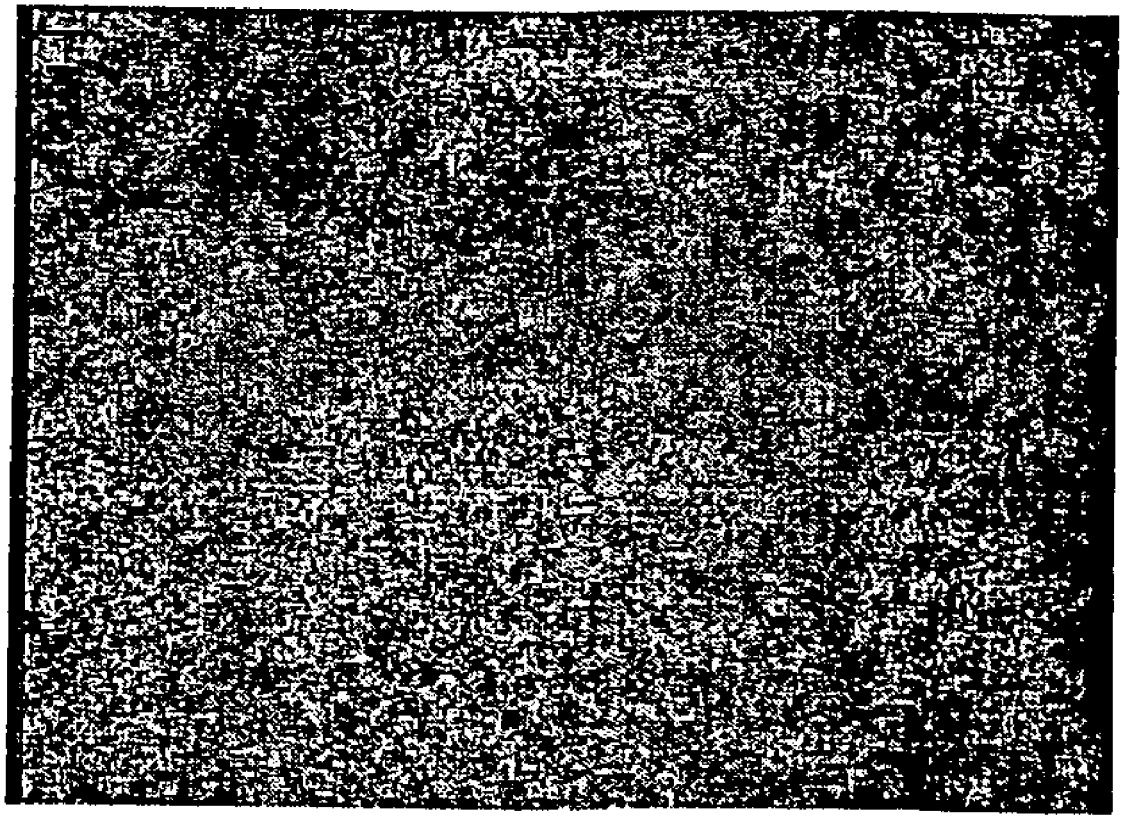
FIG. 1 is a representation of the film obtained on depositing dimethyl-platinum cyclooctadiene onto a glass substrate and subjecting the deposited film to UV radiation according to a first embodiment of the present invention.

The present invention relates to the use of photosensitive organometallic compounds in forming metal and, in particular, platinum metal deposits such as films and narrow lines via a reduction process. Organometallic compounds such as any of the following are suitable: bis-(perfluoropropyl)-1,5-cyclooctadiene platinum (II); dimethyl-platinum cyclooctadiene; bis-(perluoropropyl)-1-methyl-1,5-cyclooctadiene platinum (II); and bis-(perfluoropropyl)-1-fluoromethyl-1,5-cyclooctadiene platinum (II).

The structures of bis-(perfluoropropyl)-1,5-cyclooctadiene platinum (II); dimethyl-platinum cyclooctadiene; bis-(perfluoropropyl)-1-methyl-1,5-cyclooctadiene platinum (II); and bis-(perfluoropropyl)-1-fluoromethyl-1,5 cyclooctadiene platinum (II) are shown below:

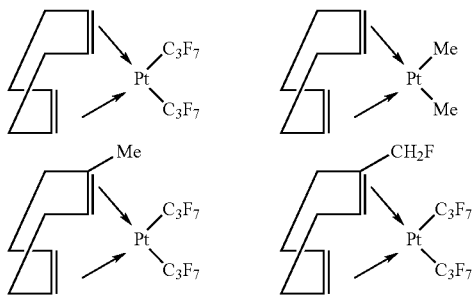

The organometallic compounds are first of all deposited onto a glass substrate via any suitable deposition technique. Usually a vacuum coating technique is used. The organometallic platinum compounds are then exposed to UV radiation, utilising a photomask if appropriate, and then reduced to, for example, platinum metal via, a 4-stage reduction process.

The 4-stage reduction process first of all involves a heating and cooling stage in an atmosphere such as an inert atmosphere (e.g. $N_2$) which dries the organometallic compound. There is then a further heating and cooling stage in an oxidising atmosphere (e.g. air) which acts to remove intercalated carbon moieties from the metallic feature. An inert gas, such as $N_2$ is then blown over the coated substrate. There is then a further heating and cooling step in a reducing atmosphere (e.g. $H_2$) wherein the oxidised metallic component is reduced to a metal. This process is found to reduce, for example, the organometallic platinum compound to platinum metal which forms, for example, a film which is continuous and uniform.

The substrates coated with organometallic compound may be masked so as to produce specific patterns of, for example, platinum metal.

It has been found that the novel compound bis-(perfluoropropyl)-1,5-cyclooctadiene platinum (II) provides good platinum films. This is discussed in more detail below.

EXAMPLES

Example 1

First of all, glass substrates of Corning 7059 glass were cleaned according to the following process:
a. Pre-cut substrates of 1 cm$^2$ were added to Desolvit 3000 (a commercial cleaning material) and exposed to ultrasonic agitation for 30 minutes.
b. The substrates were then rinsed in warm deionised water (approximately 40° C.) for 10 minutes.
c. The substrates were then briefly rinsed in deionised water.
d. Finally, blown nitrogen was used to dry the substrates.

100 mg of dimethyl-platinum cyclooctadiene was weighed out using a balance (a Mettler Toledo AB54-S) and added to a molybdenum covered boat. The substrates were then coated to a glass slide which was attached by iridium wire before being attached to a 'rotatilt table'.

The dimethyl-platinum cyclooctadiene was then deposited via evaporation onto a glass substrate. The evaporation procedure comprises placing the boat and the cleaned substrate in a vacuum coating unit. A bell jar and guard were then positioned, liquid nitrogen added to the trap and the chamber evacuated to $8 \times 10^{-6}$ mb. A current was then passed through the boat and slowly increased until the pressure in the chamber increased. The current was then held until the pressure started to decrease. This reduction in pressure indicated that the evaporation was complete. The chamber was then vented and the coated substrate removed.

The coated substrate was then irradiated with UV radiation at a wavelength of 260 nm. An OAI J500/VIS mask aligner was used to provide a total dose of 108.9 Jcm$^{-2}$ from a bulb with a power output of 16.5 mJs$^{-1}$cm$^{-2}$.

FIG. 1 which is a representation of the deposited dimethyl-platinum cyclooctadiene after exposure to UV radiation shows that the obtained film quality is poor and appears largely crystalline.

The dimethyl-platinum cyclooctadiene coated glass substrate was then reduced to platinum metal using a new 4-stage dry reduction process.

Figure 2:
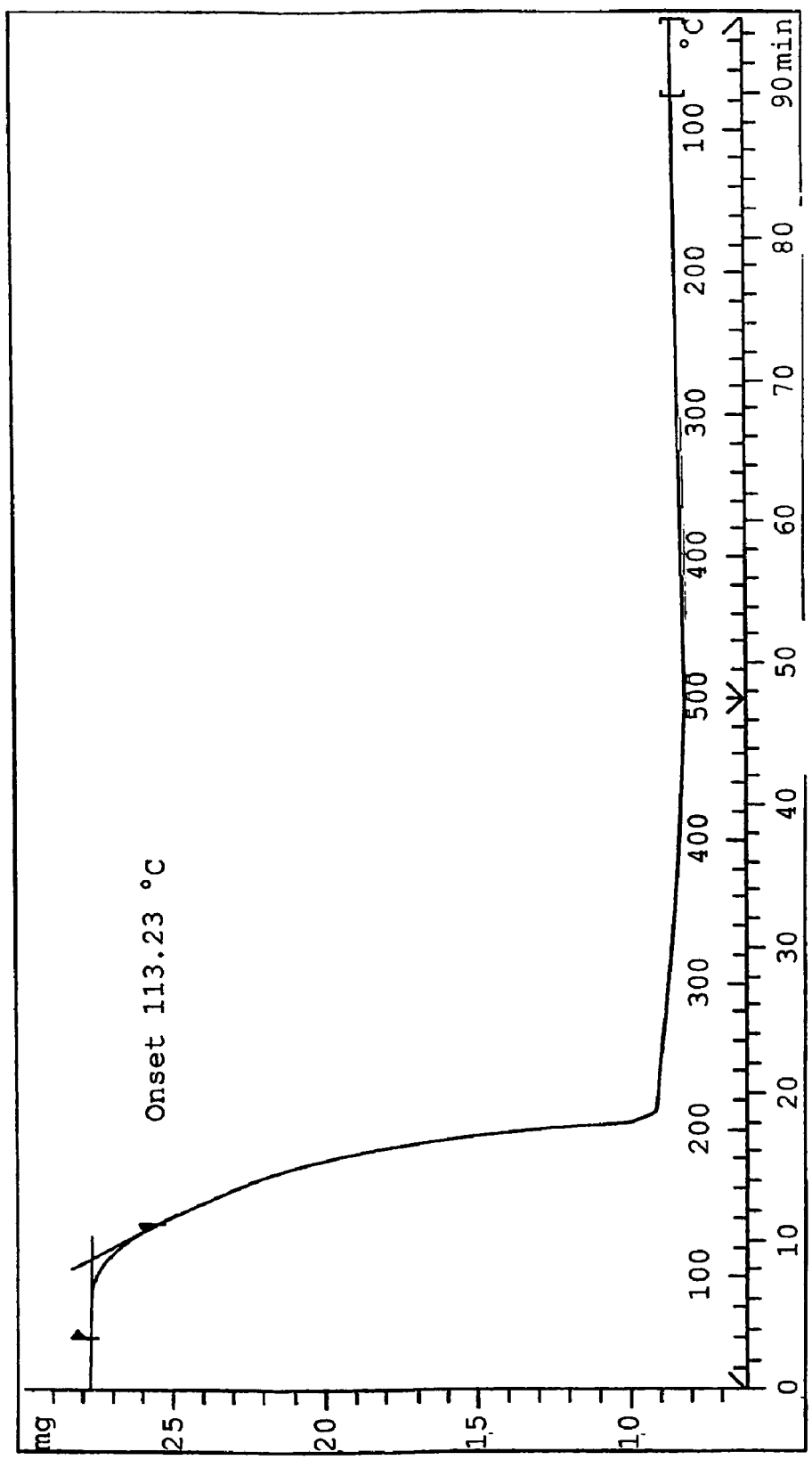
FIG. 2 is a thermal gravimetric analysis of dimethyl-platinum cyclooctadiene.

Referring to the thermal gravimetric analysis shown in FIG. 2, dimethyl-platinum cyclooctadiene is shown to start to sublime at a temperature of approximately 110° C., which is the isothermal temperature for Stage 1 in the 4-stage reduction process shown below. The 4-stage reduction process is performed as follows:

Stage 1: heating the coated substrate from about 25° C. to about 120° C. at a ramp rate of about 2° C. per minute; maintaining the temperature at about 120° C. for about 60 minutes; and then cooling the substrate from about 120° C. to about 25° C. at a ramp rate of about 10° C. per minute; wherein $N_2$ is flowed over the coated substrate at a rate of about 50 ml per minute;

Stage 2: heating the substrate from about 25° C. to about 250° C. at a ramp rate of about 5° C. per minute; maintaining the temperature at about 250° C. for about 60 minutes; and then cooling the substrate from about 250° C. to about 25° C. at a ramp rate of about 5° C. per minute; wherein the coated substrate is exposed to air;

Stage 3: flowing $N_2$ at about 25° C. over the coated substrate for about 10 minutes; and Stage 4: heating the coated substrate from about 25° C. to about 350° C. at a ramp rate of about 20° C. per minute; maintaining the temperature at about 350° C. for about 60 minutes; and then cooling the substrate from about 350° C. to about 25° C. at a rate of about 20° C. per minute; wherein a mixture of about 5% $H_2$ and 95% $N_2$ is flowed over the coated substrate at a rate of about 150 ml per minute.

Figure 3:
FIG. 3 is a representation of a platinum metal film obtained on reducing a first dimethyl-platinum cyclooctadiene coated substrate according to a first embodiment of the present invention.
Figure 4:
FIG. 4 is a representation of a platinum metal film obtained on reducing a second dimethyl-platinum cyclooctadiene coated substrate according to a first embodiment of the present invention.

FIGS. 3 and 4 are representations of the platinum metal film obtained. However, the quality and adhesion of the platinum film is rather poor with the end product failing the Scotch Tape Test. On analysing FIGS. 3 and 4 it is clear from the discontinuous pattern, that a uniform continuous film is not produced. Moreover, in FIG. 4 it appears that the platinum metal has, in fact, curled up.

Using a 4-point-probe the resistance of one of the platinum films was measured. A number of results were taken, and averaged, as follows:

$$R_1 = 1299.6 \, \Omega$$

$$R_2 = 2209.6 \, \Omega$$

$$R_3 = 7512.2 \, \Omega$$

$$R_{av} = (R_1 + R_2 + R_3)/3$$

$$= (1299.6 + 2209.6 + 7512.2)/3$$

$$= 3673.8 \, \Omega$$

An average resistance value of 3673.8 Ω was therefore obtained. The resistance value of 3673.8 Ω is very high and shows that the platinum metal film produced is either contaminated with impurities and/or is extremely thin in places. The latter seems likely as both FIGS. 3 and 4 show areas where there appears to be only a flash coating of platinum metal deposited. These areas are all interlinked and appear around the thicker metal regions thus creating a 'paving stone' effect.

In summary, the platinum metal produced from the reduction of deposited dimethyl-platinum cyclooctadiene does not produce a continuous Pt metal film and has extremely poor adhesion to the glass substrate.

Example 2

Bis-(perfluoropropyl)-1,5-cyclooctadiene platinum (II) was then used to coat a glass substrate.

Bis-(perfluoropropyl)-1,5-cyclooctadiene platinum (II) was prepared as follows. A solution of bis-methyl platinum (II) cyclooctadiene (2.6 g) was dissolved in 3 cm$^3$ of dry methylene chloride (i.e. dichloromethane) to which 2.4 cm$^3$ of n-perfluoropropyl iodide was slowly added under an inert atmosphere of argon. The reaction was shaken for 5 days in ambient conditions under an argon atmosphere, during which time a yellow/cream precipitate formed. The reaction mixture was filtered off and the solvent removed by evaporation resulting in a yellow product. A solution of the product in methylene chloride was then filtered through a short fluorosil column. The fractions containing the desired product were combined and a creamy white product crystallised out in a methylene chloride/pentane solution. A 20.5% yield of bis-(perfluoropropyl)-1,5-cyclooctadiene platinum (II) was obtained.

Figure 5:
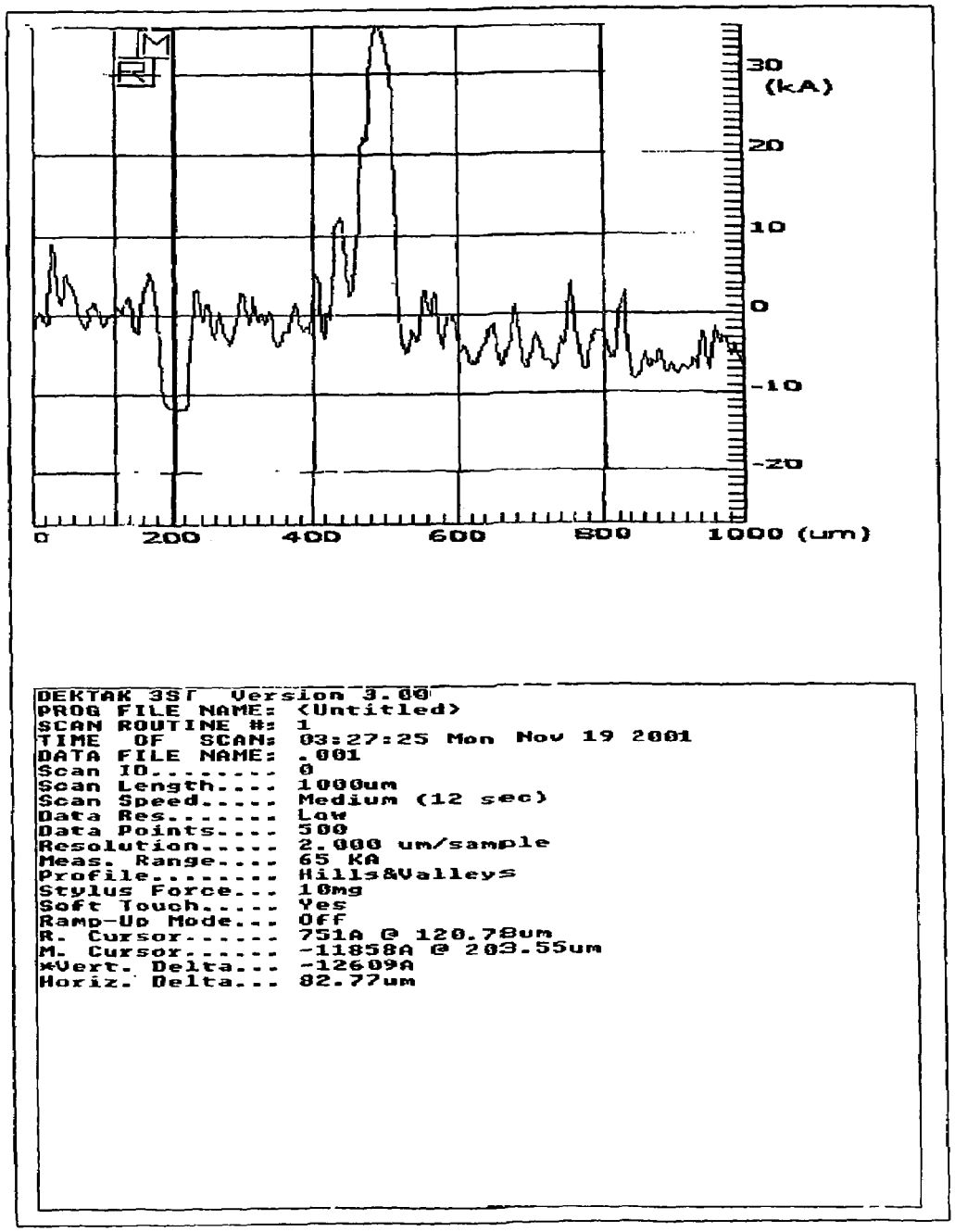
FIG. 5 is the result of measuring the thickness of 100 mg of deposited bis-(perfluoropropyl)-1,5-cyclooctadiene platinum (II) onto a glass substrate according to a second embodiment of the present invention.

A glass substrate was then cleaned and coated as before using 100 mg of bis-(perfluoropropyl)-1,5-cyclooctadiene platinum (II). As shown in FIG. 5, the coating was measured to be about 1260 nm thick.

Figure 6:
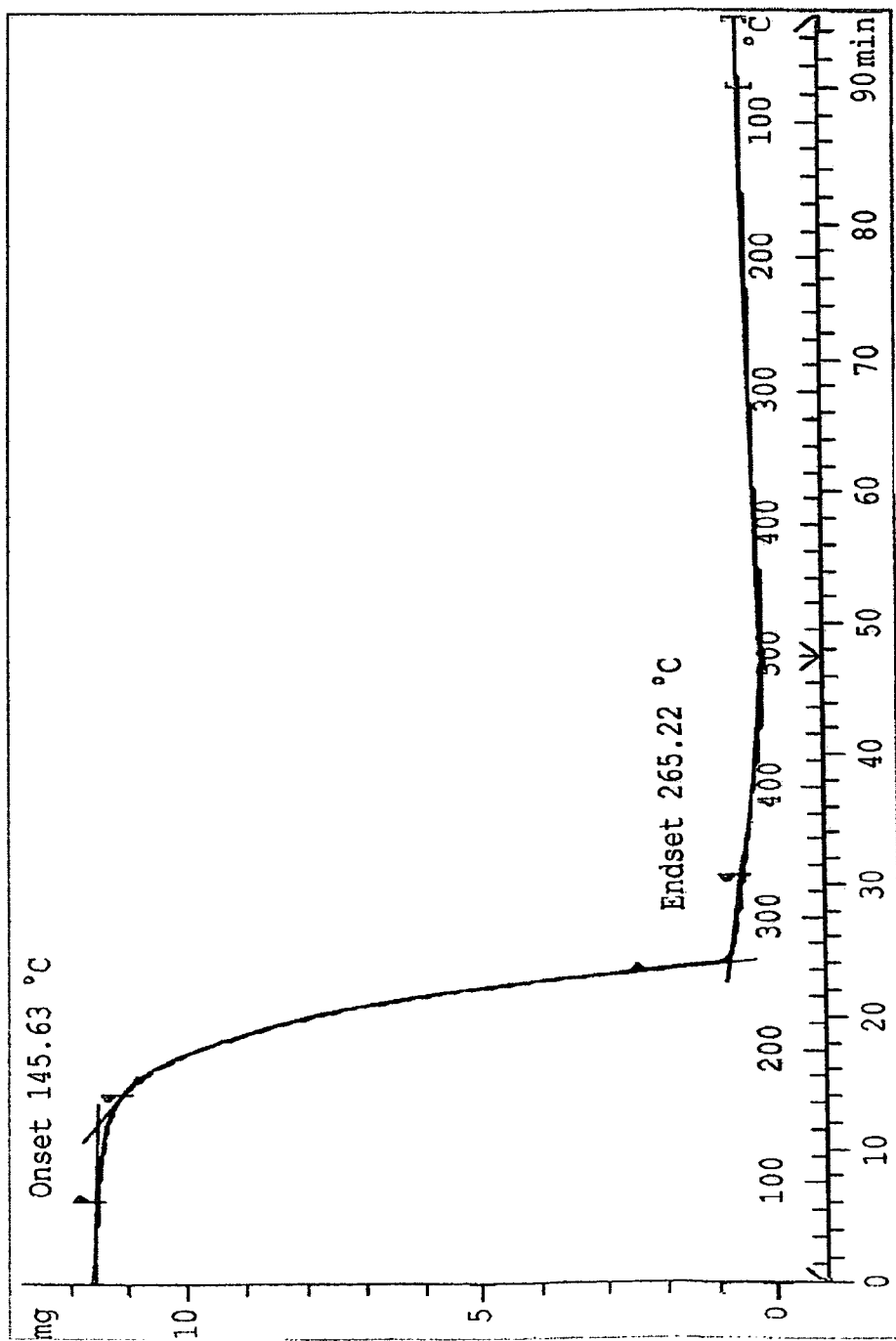
FIG. 6 is a thermal gravimetric analysis of bis-(perfluoropropyl)-1,5-cyclooctadiene platinum (II)

The thermal gravimetric analysis of bis-(perfluoropropyl)-1,5-cyclooctadiene platinum (II) is shown in FIG. 6. It is clear from the thermal gravimetric analysis that the bis-(perfluoropropyl)-1,5-cyclooctadiene platinum (II) sublimes and does not decompose.

The bis-(perfluoropropyl)-1,5-cyclooctadiene platinum (II) coated glass substrate was then exposed to UV radiation of 260 nm (as described in Example 1).

Figure 7:
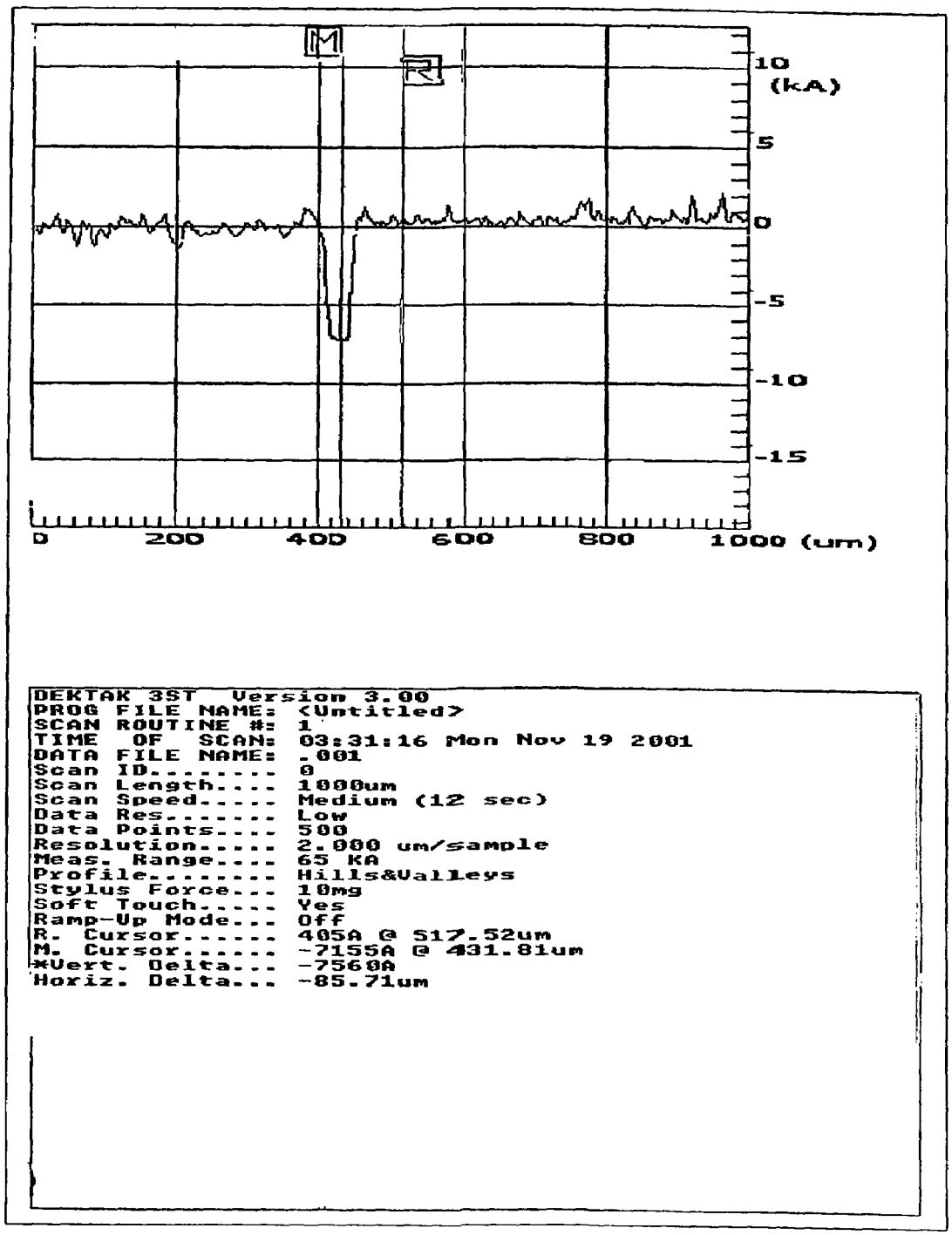
FIG. 7 is the result of measuring the thickness of film formed on exposing 100 mg of deposited bis-(perfluoropropyl)-1,5-cyclooctadiene platinum (II) to UV radiation according to a second embodiment of the present invention.

It was observed that the film on the glass substrate experienced shrinkage during the UV exposure. The surface profile in FIG. 7 shows that the film thickness was reduced by approximately 40 percent to a thickness of 750 nm on exposure to UV radiation.

Once again a 4-stage reduction process was used to metalise the film as follows:

Stage 1: heating the coated substrate from about 25° C. to about 120° C. at a ramp rate of about 2° C. per minute; maintaining the temperature at about 120° C. for about 60 minutes; and then cooling the substrate from about 120° C. to about 25° C. at a ramp rate of about 10° C. per minute; wherein N$_2$ is flowed over the coated substrate at a rate of about 50 ml per minute. This stage results in sublimation of any non-exposed area;

Stage 2: heating the substrate from about 25° C. to about 350° C. at a ramp rate of about 5° C. per minute; maintaining the temperature at about 350° C. for about 60 minutes; and then cooling the substrate from about 350° C. to about 25° C. at a ramp rate of about 5° C. per minute; wherein the coated substrate is exposed to air. This stage is a metallisation step;

Stage 3: flowing N$_2$ at about 25° C. over the coated substrate for about 10 minutes; and Stage 4: heating the coated substrate from about 25° C. to about 350° C. at a ramp rate of about 20° C. per minute; maintaining the temperature at about 350° C. for about 60 minutes; and then cooling the substrate from about 350° C. to about 25° C. at a rate of about 20° C. per minute; wherein a mixture of about 5% H$_2$ and 95% N$_2$ is flowed over the coated substrate at a rate of about 150 ml per minute.

Figure 8:
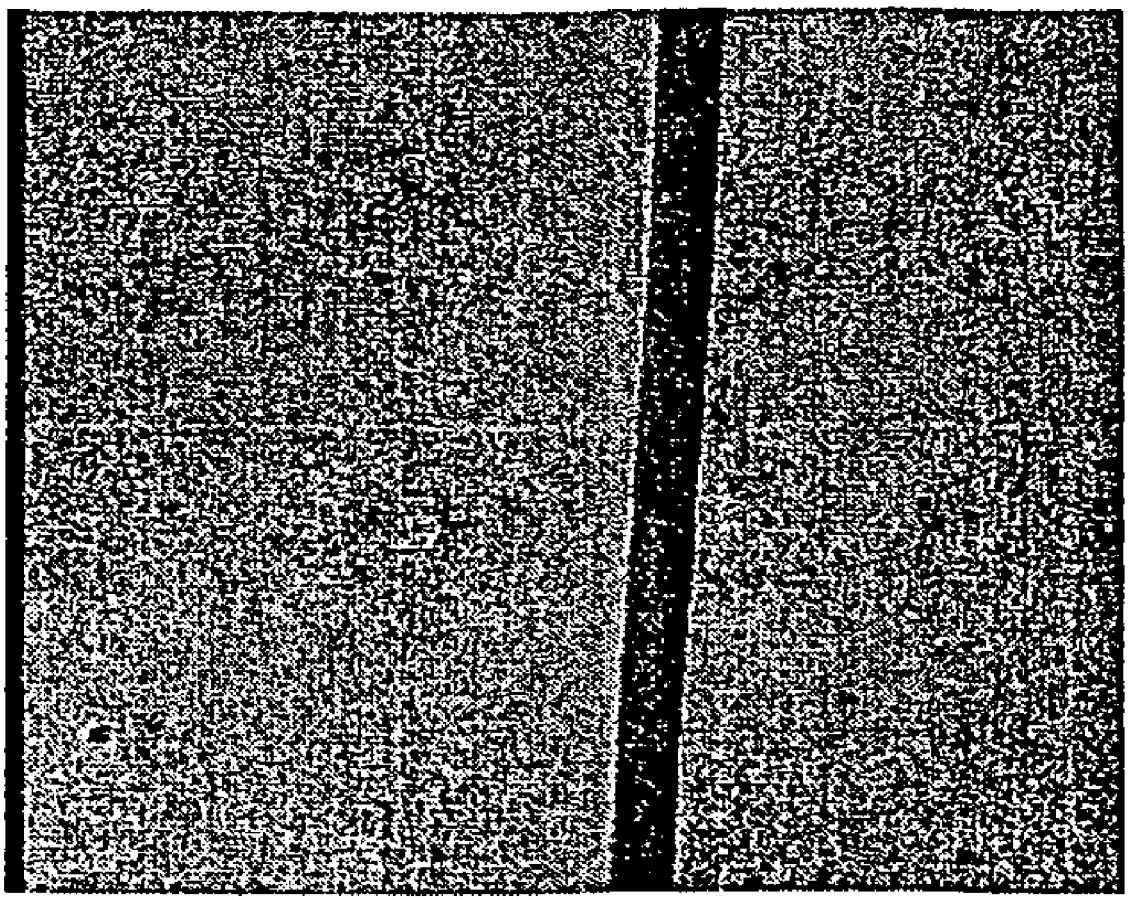
FIG. 8 is a representation of a platinum metal film obtained on reducing 100 mg of deposited bis-(perfluoropropyl)-1,5-cyclooctadiene platinum (II) according to a second embodiment of the present invention.

Following the 4-stage reduction process a sheet metal platinum metal film was obtained. The sheet metal platinum film is shown in FIG. 8. The black line is a scratch that was made following the evaporation of the film to allow the film thickness to measured.

Figure 9:
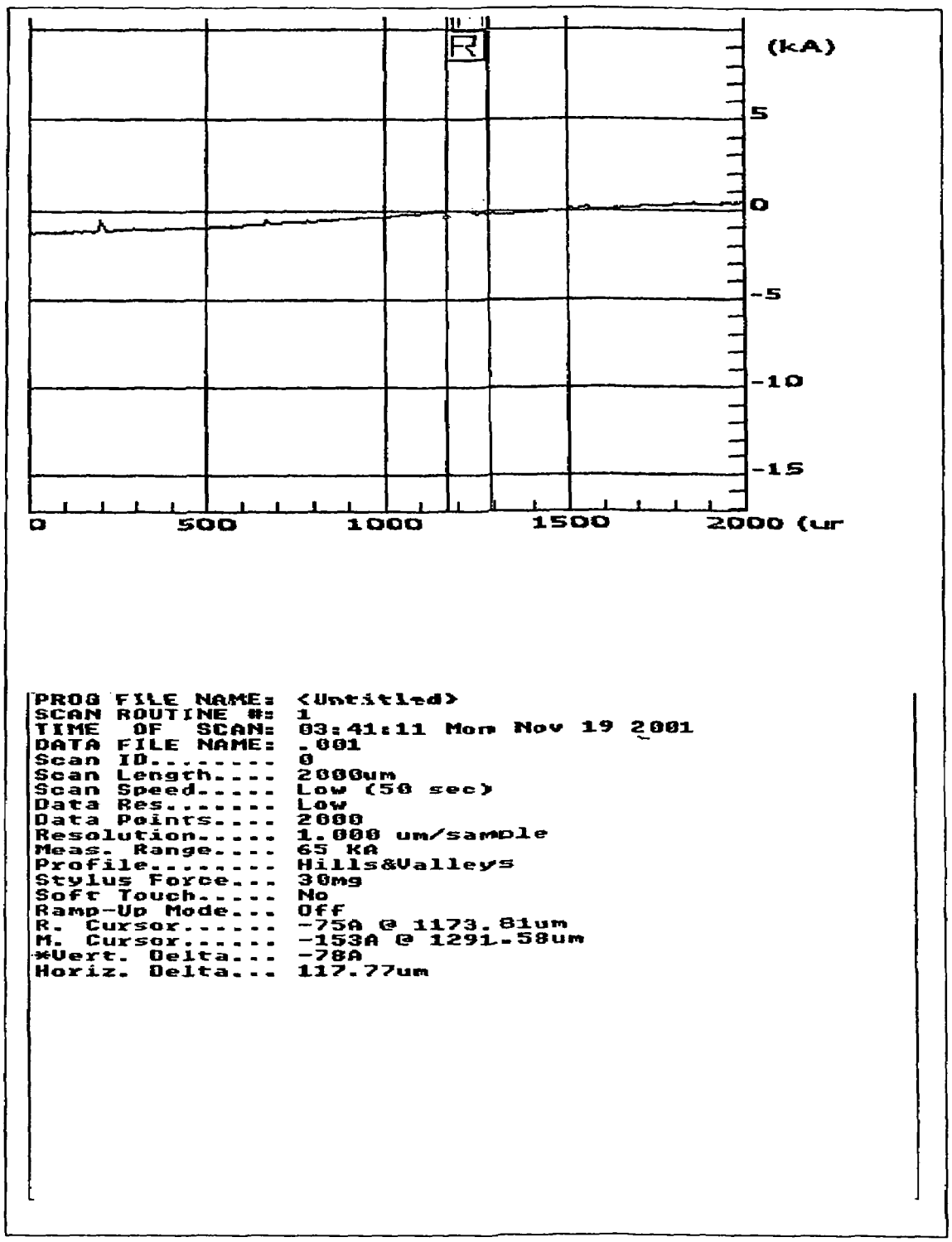
FIG. 9 is the result of measuring the thickness of the platinum metal film formed in FIG. 8.

The thickness of this film was found to be 7.8 nm as shown in FIG. 9. The resistivity is calculated as follows:

$$\rho = (\pi t/\ln 2) \times (V/I)$$

where: $(V/I) = R$
$\rho$ = resistivity of film (Ωm)
$(\pi/\ln 2) = 4.532$
$t$ = film thickness (m)
$R$ = resistance of film (Ω)

Five resistance measurements were taken from the sample at various places, the average of which was used to calculate the resistivity:

$$R_1 = 12.1870 \ \Omega$$
$$R_2 = 14.2604 \ \Omega$$
$$R_3 = 10.9215 \ \Omega$$
$$R_4 = 14.5243 \ \Omega$$
$$R_5 = 11.4818 \ \Omega$$
$$R_{av} = (R_1 + R_2 + R_3 + R_4 + R_5)/5$$
$$= 12.675 \ \Omega$$

The deposited sheet metal platinum film therefore has an average resistance of 12.675 Ω.

The resistivity is therefore calculated as follows:

$$\rho = [4.532 \times (7.8 \times 10^{-9}) \times 12.675] \ \Omega m$$
$$= 44.81 \times 10^{-8} \ \Omega m$$

The resistivity of the deposited platinum film is thus $44.81 \times 10^{-8}$ Ωm.

The sheet resistance of the film is calculated as follows:

$$R_S = \rho/t$$

where: $R_S$ = sheet resistance of film (Ω$^{-1}$)
$\rho$ = resistivity of film (Ωm)
$t$ = thickness of film (m)
$R_S = 44.81 \times 10^{-8}/7.8 \times 10^{-9}$
$R_S = 57.45 \ \Omega^{-1}$ The sheet resistance of the deposited platinum film is therefore 57.45 Ω$^{-1}$.

The bulk value of resistivity for platinum at room temperature is $10.7\times10^{-8}$ Ωm; so the calculated value is approximately 4 times the bulk value. This can be explained due to electron scattering from grain boundaries, the metal surface and the substrate. A bulk value for resistivity is not expected where measuring such a thin film.

The calculated value for resistivity shows that the process produced platinum metal with a high purity, and a uniform and continuous coverage with a thickness of about 7.8 nm.

Example 3

A glass substrate was cleaned as before and 100 mg of bis-(perfluoropropyl)-1,5-cyclooctadiene platinum (II) was deposited onto the substrate.

The coated glass substrate was exposed to UV radiation as before.

The following 4-stage reduction process was then used to reduce the deposited bis-(perfluoropropyl)-1,5-cyclooctadiene platinum (II) to platinum:
   Stage 1: heating the coated substrate from about 25° C. to about 120° C. at a ramp rate of about 2° C. per minute; maintaining the temperature at about 80° C. for about 60 minutes; and then cooling the substrate from about 80° C. to about 25° C. at a ramp rate of about 10° C. per minute; wherein $N_2$ is flowed over the coated substrate at a rate of about 50 ml per minute. This stage results in sublimation of any non-exposed area;
   Stage 2: heating the substrate from about 25° C. to about 250° C. at a ramp rate of about 5° C. per minute; maintaining the temperature at about 250° C. for about 60 minutes; and then cooling the substrate from about 250° C. to about 25° C. at a ramp rate of about 5° C. per minute; wherein the coated substrate is exposed to air. This is a metallisation step;
   Stage 3: flowing $N_2$ at about 25° C. over the coated substrate for about 10 minutes; and
   Stage 4: heating the coated substrate from about 25° C. to about 350° C. at a ramp rate of about 20° C. per minute; maintaining the temperature at about 350° C. for about 60 minutes; and then cooling the substrate from about 350° C. to about 25° C. at a rate of about 20° C. per minute; wherein a mixture of about 5% $H_2$ and 95% $N_2$ is flowed over the coated substrate at a rate of about 150 ml per minute.

The 4-stage process listed above is the same as that in Example 2 apart from Stage 2, which has a reduced isothermal temperature of 250° C. and a reduced ramp rate of 5° C. per minute.

Figure 10:
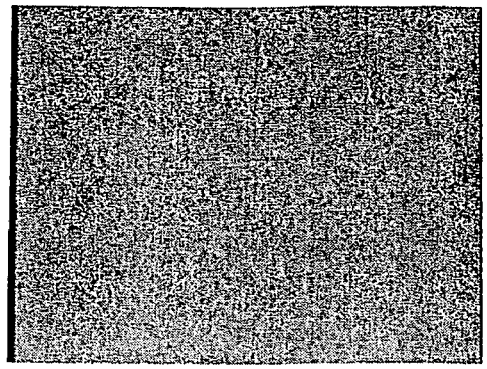
FIG. 10 is a representation of a further platinum metal film formed obtained using a bis-(perfluoropropyl)-1,5-cyclooctadiene platinum (II) in a different reduction process according to a third embodiment of the present invention.

FIG. 10 is a representation of the platinum metal film produced. It is clear that the produced platinum film is of a continuous and uniform nature. It was not possible to measure the thickness of the platinum metal film as the substrate was completely covered.

For comparison purposes, the resistance of the film was measured after Stages 2 and 4 of the metallisation process using the 4-point-probe. This experiment showed that Stage 4 of the metallisation process is a necessary step as a marked reduction in resistance was measured on completion of this stage. The resistance of the film after Stages 2 and 4 was approximately 72 Ω and 5 Ω, respectively.

The process of Stage 4 is believed to firstly, remove any surface oxygen from the metal and secondly, homogenise the metal nanoeryotallites. Both of these effects reduce the resistance and hence the resistivity of the metal.

Figure 11:
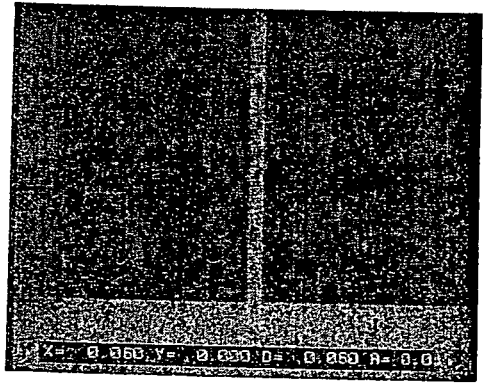
FIG. 11 is a representation of a platinum metal film formed comprising a 60 µm track according to a fourth embodiment of the present invention.
Figure 12:
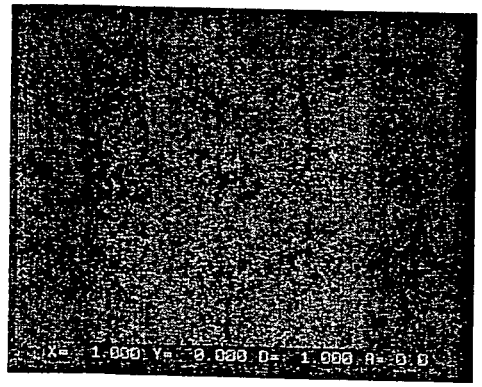
FIG. 12 is a representation of a platinum metal film formed comprising a 1 $mm^2$ pad of platinum metal formed according to a fifth embodiment of the present invention.

To improve the resolution of formed platinum, the substrate may be partly taped (i.e. masked). FIG. 11 represents a 60 µm track formed on the substrate. FIG. 12 represents a 1 mm² pad of formed platinum metal.

Example 4

As 100 mg of bis-(perfluoropropyl)-1,5-cyclooctadiene platinum (II) produced about a 750 nm thick film (Example 2) it was assumed that 150 mg of bis-(perfluoro)-1,5-cyclooctadiene platinum (II) would produce a film of approximately 1200 nm thick.

Figure 13:
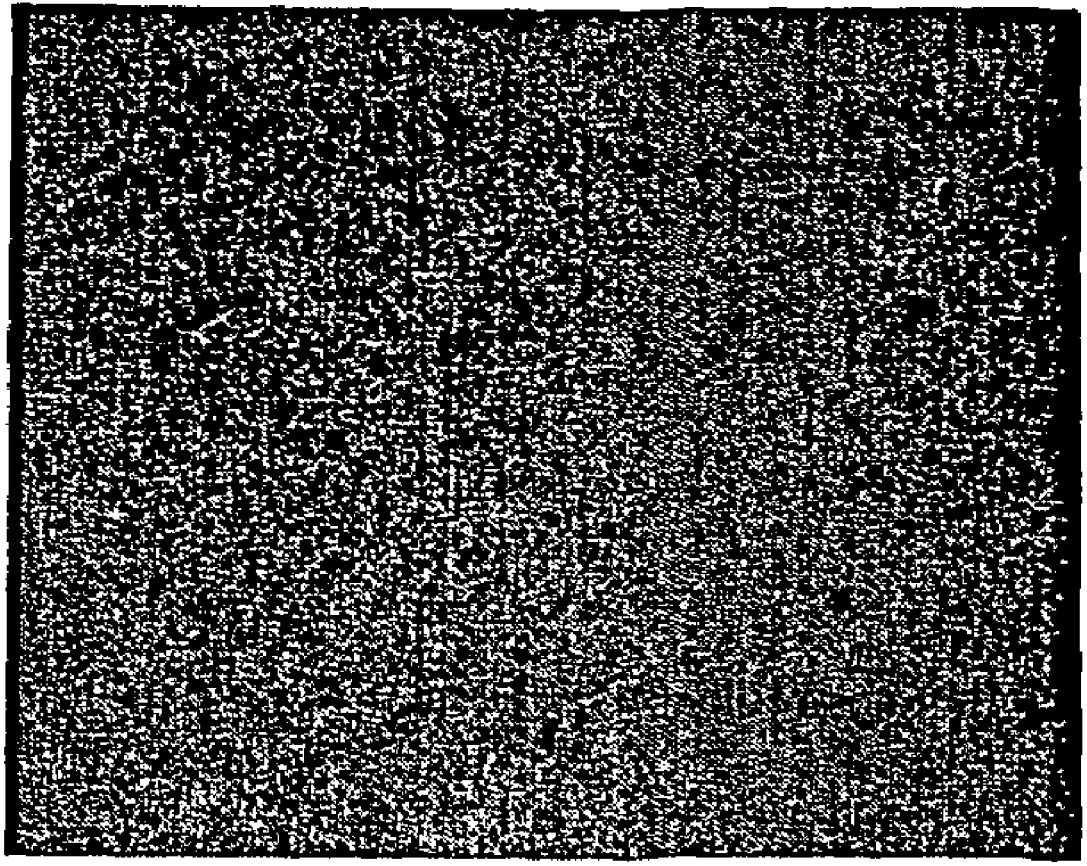
FIG. 13 is a representation of the film obtained on depositing 150 mg bis-(perfluoropropyl)-1,5-cyclooctadiene platinum (II) onto a substrate according to a sixth embodiment of the present invention.
Figure 14:
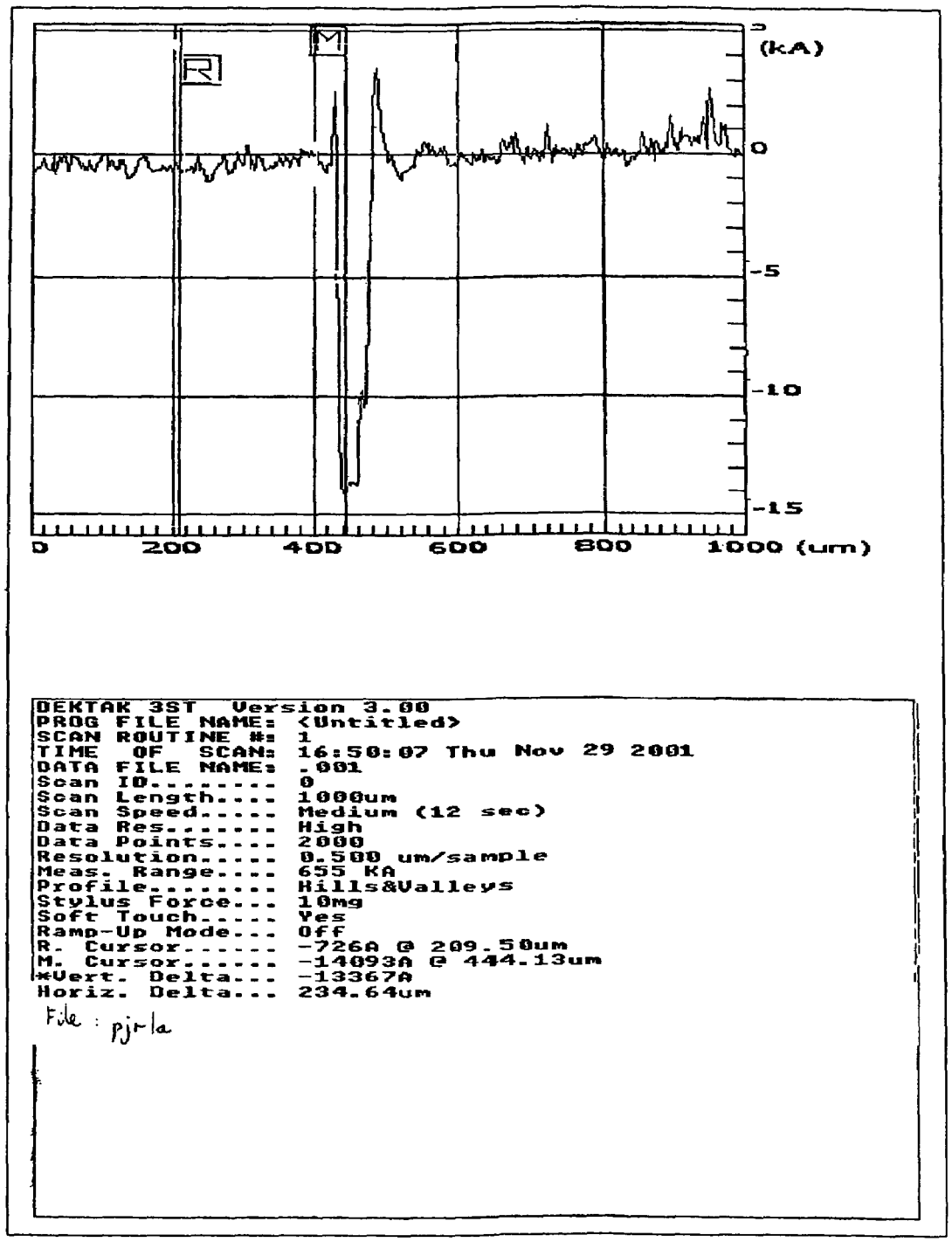
FIG. 14 is the result of measuring the thickness of the deposited bis-(perfluoropropyl)-1,5-cyclooctadiene platinum (II) shown in FIG. 13.

As previously described 150 mg of bis-(perfluoro)-1,5-cyclooctadiene platinum (II) was evaporated onto a 1 cm² glass substrate and subjected to UV radiation. The evaporated film is shown in FIG. 13. As shown in FIG. 14 a film thickness of approximately 1300 nm was obtained which was therefore in line with the assumption.

Figure 15:
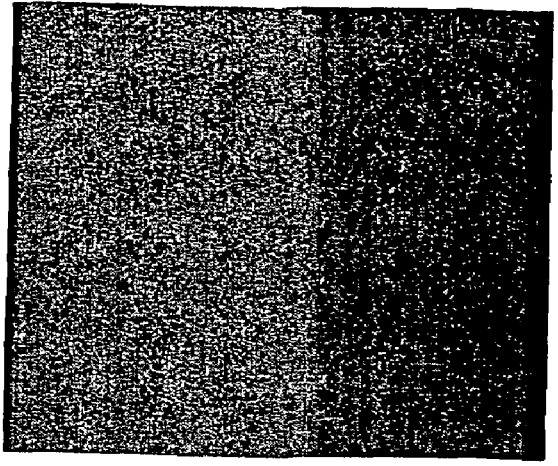
FIG. 15 is a representation of the film after masking the left-hand side of the film shown in FIG. 14 and irradiating the coated substrate with UV radiation.

A further similarly prepared, bis-(perfluoro)-1,5-cyclooctadiene platinum (II) coated glass substrate was then partly masked, on the right-hand side, with a thin piece of metal and then exposed to UV radiation as before. FIG. 15 is a representation of the glass substrate after exposure to UV radiation wherein on the left-hand side of the substrate platinum metal is to be formed.

A 4-stage reduction was then performed as follows:
   Stage 1: heating the coated substrate from about 25° C. to about 120° C. at a ramp rate of about 2° C. per minute; maintaining the temperature at about 120° C. for about 60 minutes; and then cooling the substrate from about 120° C. to about 25° C. at a ramp rate of about 10° C. per minute; wherein $N_2$ is flowed over the coated substrate at a rate of about 50 ml per minute;
   Stage 2: heating the substrate from about 25° C. to about 250° C. at a ramp rate of about 5° C. per minute; maintaining the temperature at about 250° C. for about 60 minutes; and then cooling the substrate from about 250° C. to about 25° C. at a ramp rate of about 5° C. per minute; wherein the coated substrate is exposed to air;
   Stage 3: flowing $N_2$ at about 25° C. over the coated substrate for about 10 minutes; and
   Stage 4: heating the coated substrate from about 25° C. to about 350° C. at a ramp rate of about 20° C. per minute; maintaining the temperature at about 350° C. for about 60 minutes; and then cooling the substrate from about 350° C. to about 25° C. at a rate of about 20° C. per minute; wherein a mixture of about 5% $H_2$ and 95% $N_2$ is flowed over the coated substrate at a rate of about 150 ml per minute. This final stage results in formation and densification of Platinum metal.

Figure 16:
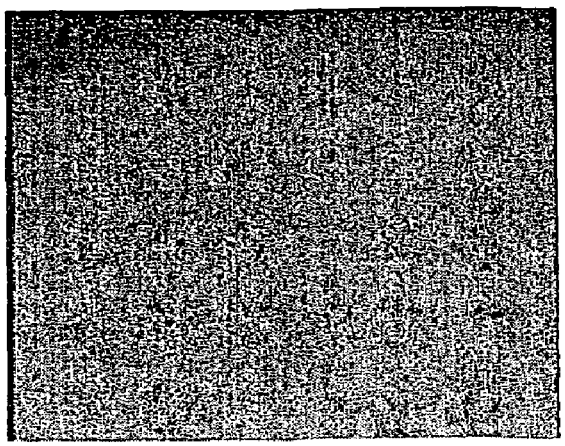
FIG. 16 is a representation of a substrate coated with bis-(perfluoropropyl)-1,5-cyclooctadiene platinum (II) as shown in FIG. 14 after a first reduction stage.
Figure 17:
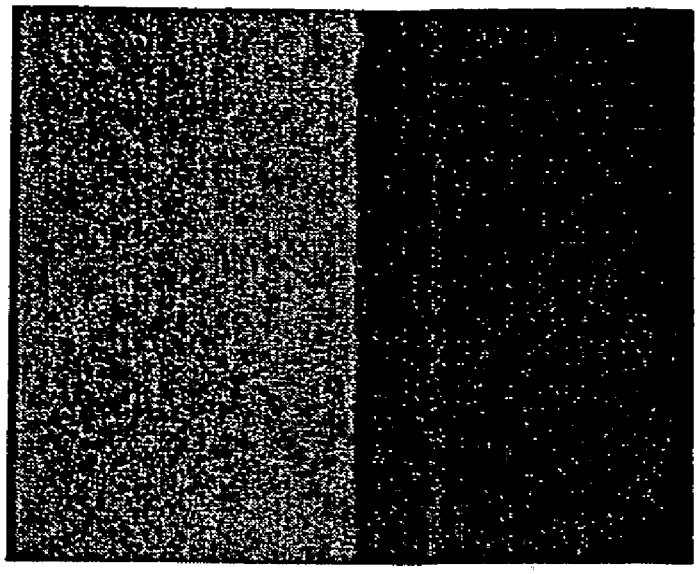
FIG. 17 is a representation of a substrate coated with bis-(perfluoropropyl)-1,5-cyclooctadiene platinum (II) as shown in FIG. 14 after a second reduction stage.
Figure 18:
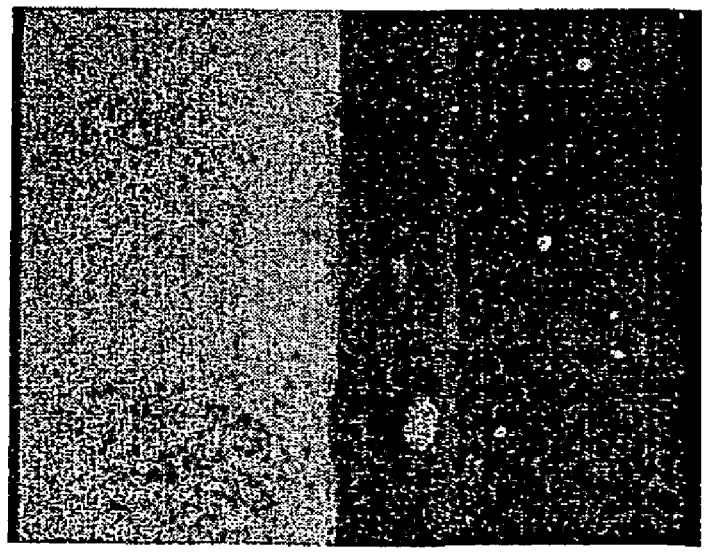
FIG. 18 is a representation of a substrate coated with bis-(perfluoropropyl)-1,5-cyclooctadiene platinum (II) as shown in FIG. 14 after a fourth reduction stage.

Pictures were taken after the first, second and fourth stages in the reduction process and are shown in FIGS. 16, 17 and 18, respectively.

Figure 19:
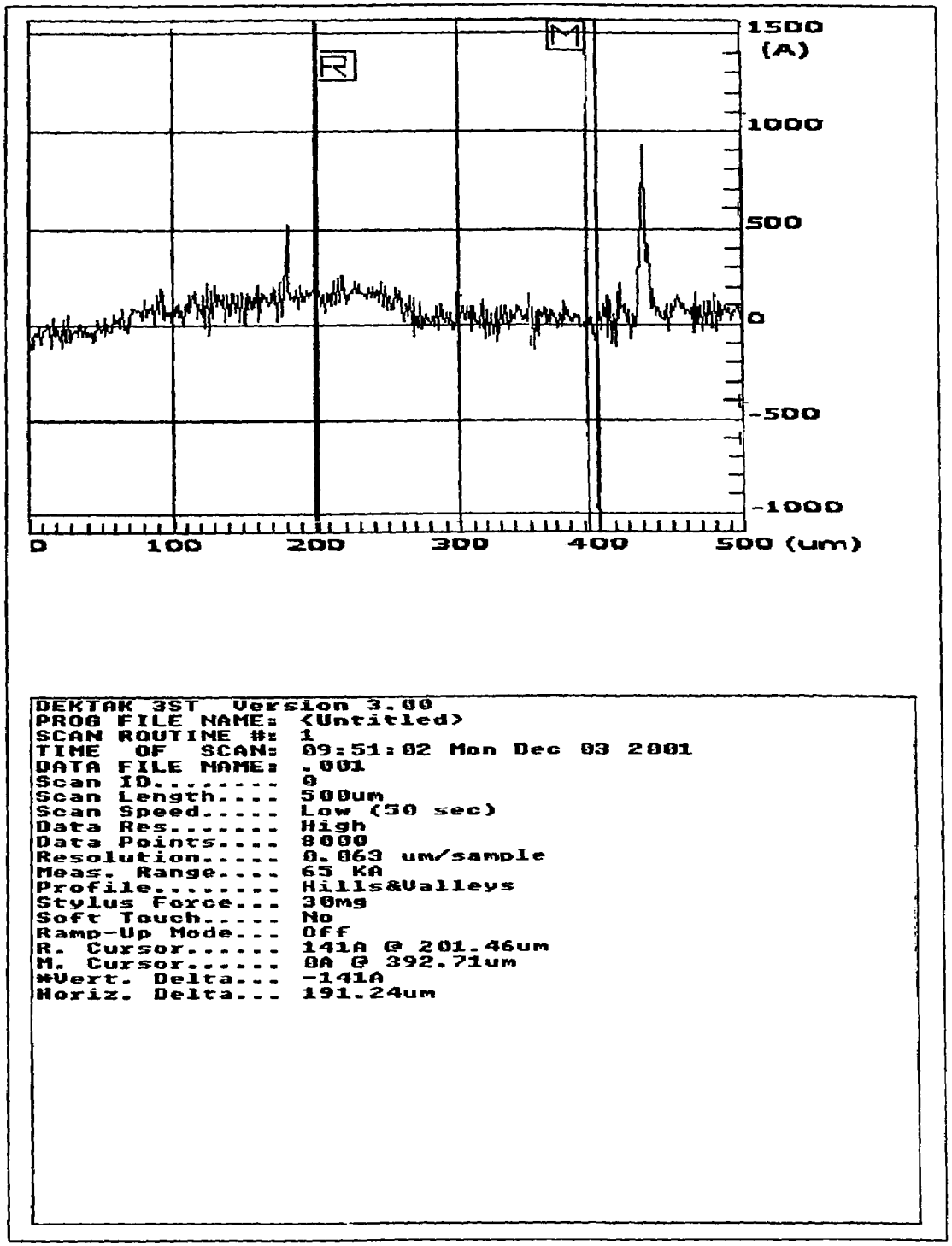
FIG. 19 is the result of measuring the thickness of the deposited platinum metal formed from the coated substrate shown in FIG. 14 after performing the four reduction stages.

The resistance of the film on the substrate was measured using the 4-point-probe after Stages 2 and 4 of the metallisation process. The resistance was found to be 12 Ω and 4.4 Ω, respectively. It is therefore obvious that Stage 4 of the process is essential in the process. The thickness of the platinum metal film was found to be approximately 16 nm, as shown in FIG. 19. This resistance along with the thickness of the metal film allowed the resistivity and sheet resistance values to be calculated as follows:

$$\rho=(\pi t/\ln 2)\times(V/I)$$

where: $(V/I)=R$
   $\rho$=resistivity of film (Ωm)
   $(\pi/\ln 2)=4.532$ t=film thickness (m)
R=resistance of film (Ω)

The film thickness was measured to be approximately 16 nm.

$$\rho = 4.532 \times (16 \times 10^{-9}) \times 4.4$$
$$= 31.91 \times 10^{-8} \, \Omega m$$

The resistivity of the film is therefore $31.91 \times 10^{-8}$ Ωm.
The sheet resistance is calculated as follows:

$$R_s = \rho/t$$

where: $R_s$=sheet resistance of film ($\Omega^{-1}$)
ρresistivity of film (Ωm)
t=thickness of film (m)

$$R_s = 31.91 \times 10^8 / 16 \times 10^{-9}$$
$$= 19.94 \, \Omega^{-1}$$

The sheet resistance of the film is therefore 19.94 $\Omega^{-1}$. The obtained value of resistivity is approximately 3 times that of the bulk resistivity value for platinum (i.e $10.7 \times 10^{-8}$ Ωm) and is an improvement on the resistivity obtained in Example 2. The reason for this improvement is that electron scattering effects are less predominant as the film thickness increases.

The invention claimed is:

1. A method for forming metal deposits on a substrate comprising:
   a) depositing a photosensitive organometallic compound onto a substrate;
   b) irradiating the photosensitive organometallic compound with UV radiation;
   c) reducing the irradiated photosensitive organometallic compound to form metal deposits adhered to the substrate in a process which comprises:
      1) a first heating and cooling stage;
      2) a second heating and cooling stage in an oxidizing atmosphere;
      3) flowing an inert gas over the substrate; and
      4) a third heating and cooling stage wherein a reducing gas flows over the substrate to form metal deposits; and
   d) removing any degraded photosensitive organometallic compound residue and unaffected photosensitive organometallic compound from said substrate.

2. A method for forming metal deposits on a substrate according to claim 1 wherein the first heating and cooling stage is in an inert atmosphere such as a noble gas.

3. A method for forming metal deposits on a substrate according to claim 2 wherein the noble gas is dinitrogen.

4. A method of forming metal deposits on a substrate according to claim 1 wherein the oxidizing atmosphere comprises a dioxygen containing atmosphere such as air.

5. A method of forming metal deposits on a substrate according to claim 1 wherein the reducing gas in the third heating and cooling stage comprises at least dihydrogen.

6. A method for forming metal deposits on a substrate comprising:
   a) depositing a photosensitive organometallic compound corresponding to formula (I) as described below

(I)

wherein:
   M is a member of the group consisting of platinum, palladium, copper, rhodium, tungsten, iridium, silver, gold and tantalum;
   A is any of oxygen, sulphur, an amide grouping, an amine grouping or an ester grouping;
   x is 0 or 1;
   R is a fluoroorgano group; and
   L is a bidentate ligand;
   b) irradiating the photosensitive organometallic compound with UV radiation;
   c) reducing the irradiated photosensitive organometallic compound to form metal deposits adhered to the substrate; and
   d) removing any degraded photosensitive organometallic compound residue and unaffected photosensitive organometallic compound from said substrate.

7. A method for forming metal deposits on a substrate comprising:
   a) depositing a photosensitive organometallic compound selected from the group consisting of: bis-(perfluoropropyl)-1,5-cyclooctadiene platinum (II); bis-(perfluoropropyl)-1-methyl-1,5-cyclooctadiene platinum (II); and bis-(perfluoropropyl)-1-fluoromethyl-1,5-cyclooctadiene platinum (II) onto a substrate;
   b) irradiating the photosensitive organometallic compound with UV radiation;
   c) reducing the irradiated photosensitive organometallic compound to form metal deposits adhered to the substrate; and
   d) removing any degraded photosensitive organometallic compound residue and unaffected photosensitive organometallic compound from said substrate.

8. A method for forming metal deposits on a substrate comprising:
   a) depositing a photosensitive organometallic compound onto a substrate;
   b) irradiating the photosensitive organometallic compound with UV radiation;
   c) reducing the irradiated photosensitive organometallic compound to form metal deposits adhered to the substrate by a process comprising:
      (1) heating the coated substrate from about 25° C. to about 12° C. at a ramp rate of about 2° C. per minute; maintaining the temperature at about 80° C. for about 60 minutes; and then cooling the substrate from about 80° C. to about 25° C. at a ramp rate of about 10° C. per minute; wherein $N_2$ is flowed over the coated substrate at a rate of about 50 ml per minute;
      (2) heating the substrate from about 25° C. to about 250° C. at a ramp rate of about 5° C. per minute; maintaining the temperature at about 250° C. for about 60 minutes; and then cooling the substrate from about 250° C. to about 25° C. at a ramp rate of about 5° C. per minute; wherein the coated substrate is exposed to air;
      (3) flowing $N_2$ at about 25° C. over the coated substrate for about 10 minutes; and
      (4) heating the coated substrate from about 25° C. to about 350° C. for about 60 minutes; and then cooling the substrate from about 350° C. to about 25° C. at a rate of about 20° C. per minute; wherein a mixture of about 5% $H_2$ and 95% $N_2$ is flowed over the coated substrate at a rate of about 150 ml per minute; and d) removing any degraded photosensitive organometallic compound residue and unaffected photosensitive organometallic compound from said substrate.

9. A method for forming metal deposits on a substrate comprising:

a) depositing a photosensitive organometallic compound onto a substrate;

b) irradiating the photosensitive organometallic compound with UV radiation;

c) reducing the irradiated photosensitive organometallic compound to form metal deposits adhered to the substrate by a process comprising:

1) heating the coated substrate from about 25° C. to about 120° C. at a ramp rate of about 2° C. per minute; maintaining the temperature at about 80° C. for about 60 minutes; and then cooling the substrate from about 80° C. to about 25° C. at a ramp rate of about 10° C. per minute; wherein $N_2$ is flowed over the coated substrate at a rate of about 50 ml per minute;

2) heating of the substrate from about 25° C. to about 350° C. at a ramp rate of about 20° C. per minute; maintaining the temperature at about 350° C. for about 60 minutes; and then cooling the substrate from about 350° C. to about 25° C. at a ramp rate of about 20° C. per minute; wherein the coated substrate is exposed to air;

3) flowing $N_2$ at about 25° C. over the coated substrate for about 10 minutes; and 4) heating the coated substrate from about 25° C. to about 350° C. at a ramp rate of about 20° C. per minute; maintaining the temperature at about 350° C. for about 60 minutes; and then cooling the substrate from about 350° C. to about 25° C. at a rate of about 20° C. per minute; wherein a mixture of about 5% $H_2$ and 95% $N_2$ is flowed over the coated substrate at a rate of about 150 ml per minute; and d) removing any degraded photosensitive organometallic compound residue and unaffected photosensitive organometallic compound from said substrate.

* * * * *